United States Patent

Füglister

[11] Patent Number: 5,901,034
[45] Date of Patent: May 4, 1999

[54] ELECTRONIC INSTRUMENT

[75] Inventor: Marcel Füglister, Gansingen, Switzerland

[73] Assignee: Asea Brown Boveri AG, Baden, Switzerland

[21] Appl. No.: 08/908,679

[22] Filed: Aug. 7, 1997

[30] Foreign Application Priority Data

Aug. 23, 1996 [DE] Germany .......................... 196 34 002

[51] Int. Cl.$^6$ .............................. G05D 16/20; H02B 1/10
[52] U.S. Cl. .............................. 361/641; 73/706; 137/85; 174/52.1; 361/752
[58] Field of Search ................................. 73/706, 861.52; 137/82–85, 625.63, 625.64; 361/641, 643, 679, 736, 752; 174/50, 50.5, 50.54, 52.1, 52.3

[56] References Cited

U.S. PATENT DOCUMENTS

| 3,835,353 | 9/1974 | Hermstein et al. . |
| 5,053,924 | 10/1991 | Kurgan . |
| 5,159,949 | 11/1992 | Prescott ...................................... 137/84 |
| 5,533,544 | 7/1996 | Good .......................................... 137/85 |
| 5,806,565 | 9/1998 | Kadlicko .............................. 137/625.63 |

FOREIGN PATENT DOCUMENTS

| 2634618 | 1/1990 | France . |
| 2629107 | 1/1978 | Germany . |
| 2939006A1 | 4/1981 | Germany . |
| 2746221C2 | 7/1983 | Germany . |
| 3313967A1 | 10/1984 | Germany . |
| 3414786C2 | 2/1986 | Germany . |
| 8801177 U | 4/1988 | Germany . |
| 8907784 U | 10/1989 | Germany . |
| 3815642A1 | 11/1989 | Germany . |
| 9004684 U | 8/1990 | Germany . |
| 9106245 U | 8/1991 | Germany . |
| 9106514 U | 9/1991 | Germany . |
| 4313776C1 | 10/1994 | Germany . |
| 4234919C2 | 11/1994 | Germany . |
| 4210979C2 | 7/1995 | Germany . |
| 4447513A1 | 2/1996 | Germany . |

Primary Examiner—Gerald Tolin
Attorney, Agent, or Firm—Burns, Doane, Swecker & Mathis, L.L.P.

[57] ABSTRACT

The electronic instrument has a two-part housing (26, 27) which surrounds in a dusttight manner a printed board fitted with at least one electronic component. The housing (26, 27) contains a ventilating orifice (50) led through one of its two parts. A ventilating device (51) is arranged in this ventilating orifice (50), with an air-permeable diaphragm permeable to water vapor in a directionally dependent manner and with a splashwater guard preceding the diaphragm.

Undesirable condensation water in the housing interior is avoided, since excess water vapor present in the housing interior is led outward through the diaphragm while the electronics are operating. At the same time, the splashwater guard prevents the diaphragm from coming into contact with splashwater and its operating capacity from being impaired.

10 Claims, 5 Drawing Sheets

ELECTRONIC INSTRUMENT

BACKGROUND OF THE INVENTION

1. Field of the Invention

The invention proceeds from an electronic instrument according to the preamble of patent claim 1. Particularly in power engineering, electronic instruments are often exposed to atmospheric conditions. In this case, condensing water vapor may appreciably impair the operating capacity of the electronic components present in the instrument.

2. Description of Background

An electronic instrument of the type initially mentioned is described in DE 42 10 979 C2. This instrument contains a printed board 3 fastened in a two-part watertight housing 1 and capable of being fitted with electrical and/or optical elements. The housing interior communicates with the outside air via a duct 20 and a ventilating element 23 which closes off the duct and which is composed of a textile diaphragm made of gas-permeable and liquid-tight PTFE. This prevents water from infiltrating into the housing interior and, at the same time, ensures sufficient gas exchange. A transparent cover 25 screens off an electrical connector 2 of the printed board and the diaphragm against environmental influences.

DE 43 13 776 C1 discloses a socket-shaped ventilating device for an instrument housing. This ventilating device has a two-part splashwater guard with a tubular socket 3 and with a bowl 4. The tubular socket and the bowl have shaped into them a labyrinth which connects the housing interior to the outside air, allows water to escape from the housing interior and prevents splashwater from penetrating. Dust is kept away from the housing interior by a dust filter arranged in the tubular socket 3.

SUMMARY OF THE INVENTION

Accordingly, one object of the invention, as defined in patent claim 1, is to provide an electronic instrument of the type initially mentioned, which can be produced simply and cost-effectively and which is distinguished by high operating reliability, even under extreme climatic conditions.

The instrument according to the invention is distinguished in that, although it can be used under extreme climatic conditions, it only has an airpermeable housing which is closed off in a watertight manner and is therefore easy to manufacture. Since the interior of the housing is exposed to the atmospheric air pressure, electronics of the instrument can be checked and revised at any time under atmospheric conditions by opening the housing.

Since a splashwater guard is also provided in addition to a water-repellent and gas-permeable diaphragm arranged in a ventilating orifice of the housing wall, the formation of condensation water in the housing interior and the penetration of splashwater into the housing interior and, consequently, an impairment of the operating capacity of the electronics are prevented with a high degree of reliability.

The splashwater guard preceding the diaphragm and designed as a bolt fixes the diaphragm inside the bolt in a gastight manner and thus allows a particularly simple and compact design of the ventilating device. At the same time, the splashwater guard ensures that splashwater which has penetrated can escape again, even if the position of the electronic instrument has changed. A precipitation of water on the diaphragm can thus be avoided with a high degree of reliability. Precipitated water which may have frozen could otherwise clog the diaphragm. Water vapor formed in the housing interior could then no longer be led outward through the diaphragm.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
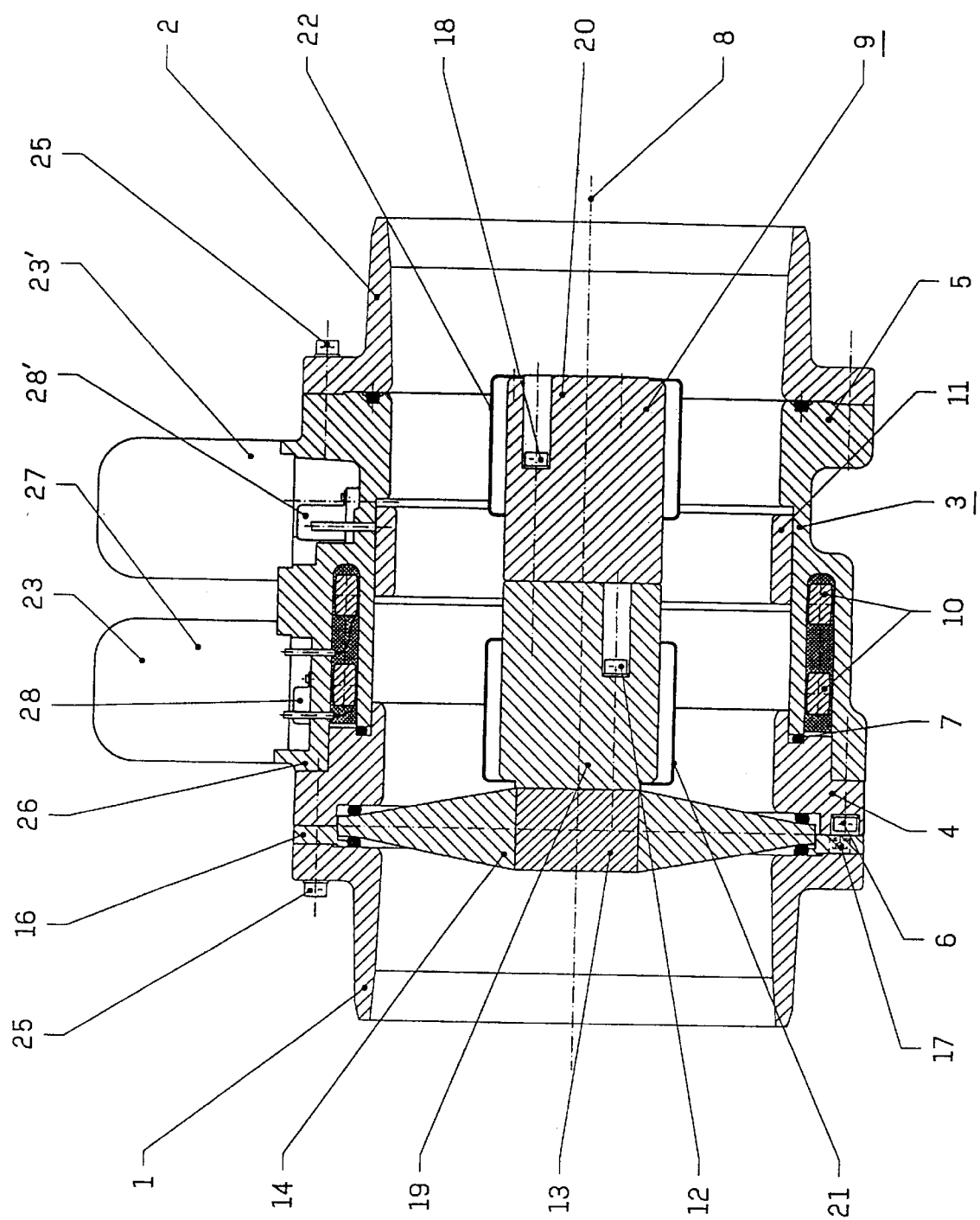
FIG. 1 shows, in axial section, part of a gas-insulated, metal-encased high-voltage system with an electronic instrument according to the invention which is installed in the metal casing and which has a two-part metal housing.

Referring now to the drawings, wherein like reference numerals designate identical or corresponding parts throughout the several views, in FIG. 1 the measuring device illustrated has a casing tube 3 clamped between two flanges 1, 2 of a metal casing filled with an insulating gas, such as, in particular, $SF_6$, having a pressure of up to a few bar. The casing tube 3 is formed by two metallic tubular portions 4, 5 which each have a flange and which are braced with one another in a gastight manner by means of screws 6 and a sealing ring 7. A current conductor 9 which is of essentially cylindrical design 9 and which is at a high-voltage potential of typically several hundred kV is led along the axis 8 of the casing tube 3. Two Rogovski coils 10, which detect the current carried in the current conductor 9, are located in a cavity delimited by the two tubular portions 4, 5. On the casing tube inner face confronting the current conductor 9, a metallic measuring electrode 11, arranged so as to be electrically insulated relative to the casing tube 3 and recording the high voltage applied to the current conductor 9, is mounted in an annular groove delimited by the tubular portions 4 and 5.

The current conductor 9 is rigidly connected by means of screws 12 to a cast-in reinforcement 13 of an insulator 14, said reinforcement being arranged on the axis 8. The screws 12 are led in the direction of the axis 8 and are protected against unauthorized actuation by means of sealing (sealing lacquer) or lead sealing. The annular outer edge of the insulator 14 is fixed to the flange of the tubular portion 4 by means of an axially guided retaining ring 16. Screws 17 fixing the retaining ring 16 on the tubular portion 4 are likewise protected against unauthorized actuation by means of sealing or lead sealing.

As is evident, the current conductor 9 is formed by two conductor portions 19, 20 rigidly connected to one another by means of axially guided screws 18. This ensures that the screws 12 fixing the current conductor 9 to the insulator 14 can be relatively short. The screws 18, like the screws 12 and 17, are protected against unauthorized actuation by means of sealing or lead sealing. The same also applies accordingly to further screws, not designated, which serve to fasten screens 21, 22 rigidly to the current conductor 9.

Due to the rigid fastening of the current conductor 9 to the insulator 14 connected fixedly to the casing tube 3, instead of the otherwise customary floating mounting of the current conductor 9 on spring contacts, and due to the defined retention of the screens, a specific field geometry can be adhered to inside the casing tube 3. This is of particular importance for the accuracy of a voltage-proportional signal emitted by the measuring electrode 11. The securing of the screws 12, 17, 18 and of the screens 21, 22 ensures that, after that part of the measuring device which is subjected to high voltage has been completed, the field geometry of the latter is not changed. The sensors contained in the measuring device, such as the Rogovski coils 10, the measuring electrode 11 and further sensors present if appropriate, such as, for example, temperature, pressure and density sensors, partial-discharge sensors and arc monitors, can then be calibrated, and the calibration values thereby determined as well as further characteristic quantities, such as compensating curves which, for example, record temperature-related measurement deviations, can be stored in a non-overwritable data memory (for example, a PROM) of an electronic evaluation device 23 of the measuring device, said evaluation device being arranged outside the insulating-gas-filled interior of the casing tube 3. This data memory can likewise be protected against unauthorized actuation by means of lead sealing or sealing and is accessible only to the electronics of the evaluation device 23. If the electronics of the evaluation device 23 have defects, after they have been exchanged the electronics newly inserted into the evaluation device can have direct access to the data filed in the PROM. Calibrating work when the electronics are exchanged can therefore be dispensed with.

The measuring device according to FIG. 1 can be installed in the metal casing in a gastight manner (sealing rings evident from the Figures, but not designated) by bracing the flange 1 and the tubular portion 4 as well as the flange 2 and the tubular portion 5 by means of tension screws 25.

The outputs of the Rogovski coils 10 and of the measuring electrode 11 are led via screened measuring cables and housing leadthroughs, of which the housing leadthrough for the measuring cable connected to the measuring electrode 11 is of gastight design, to the evaluation device 23 accommodated in a two-part metal housing. A further evaluation device 23' may be provided in a further metal housing. The evaluation device 23 may be intended predominantly for processing the output signals from the Rogovski coils 10 and the evaluation device 23' predominantly for processing the output signals from the measuring electrode 11. However, the output signals from the Rogovski coils 10 may also be led into the evaluation device 23' and, conversely, the output signals from the measuring electrode 11 led into the evaluation device 23. The evaluation device 23 may also perform the functions of the evaluation device 23' and the evaluation device 23' the functions of the evaluation device 23. The two evaluation devices 23 and 23' may also cooperate in synchronism. Such a measuring device has particularly high redundancy, since, in the event of the failure of one of the two evaluation devices, the evaluation device which is still ready for operation can carry out the further processing of the sensor output signals.

One part of the metal housing is formed in each case by a metallic hollow flange 26 formed onto the outer face of the casing tube 3 and by that region of the casing tube 3 which is bordered by the hollow flange. The other part is a housing element 27 which is recessed in a trough-shaped manner and which is fastened with its edge delimiting the trough orifice to the metallic hollow flange 26 of the casing tube 3. The evaluation device 23 is accommodated in this metal housing so as to be protected against electromagnetic and mechanical effects. Since long transmission paths between the sensors and the evaluation device 23 and resulting faults therefore no longer occur, the processing speed and measuring accuracy can be increased considerably.

Figure 2:
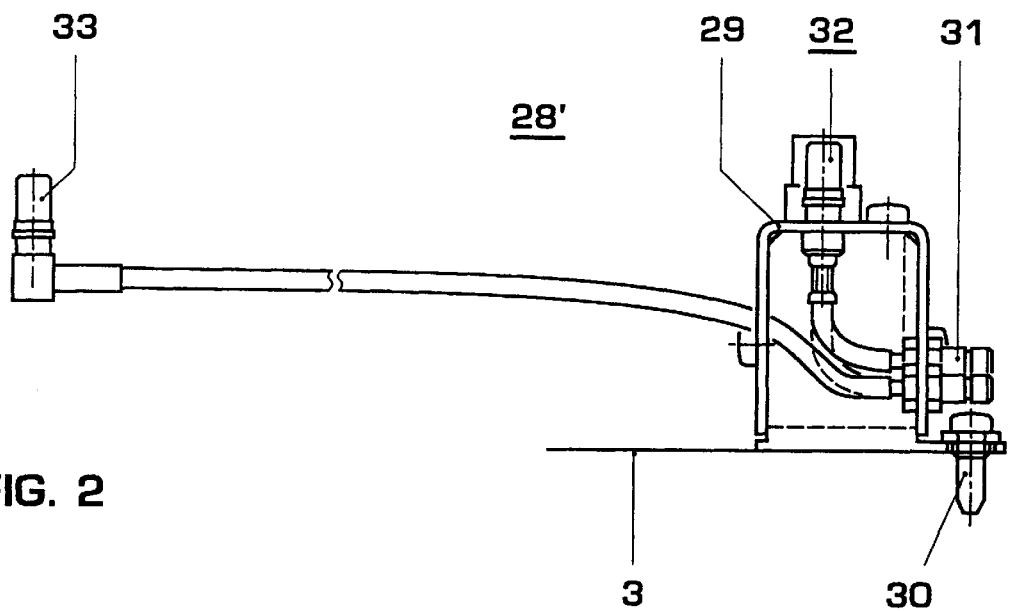
FIG. 2 shows a side view of part of a plug device arranged in the metal housing, said part being designed as a jack strip, for connecting the outputs of sensors of the high-voltage system to an evaluation device provided in the electronic instrument according to FIG. 1.

The screened measuring cables leading the output signals of the sensors into the metal housing are led to a plug device 28 or 28' arranged inside the metal housing. The plug device 28 or 28' has a plug part floatingly mounted in a plane bearing face of the bordered region of the casing tube 3, said bearing face being extended transversely to the plugging direction. This plug part is illustrated in FIG. 2 for the plug device 28'. It has an angled jack strip 29 containing a profile in the form of a Z-angle. A lower leg of the Z-angle, said lower leg being guided in the plane bearing face, is floatingly mounted by means of screws 30 held on the casing tube. A middle leg of the Z, said middle leg being attached in an L-shaped manner, carries a coupling piece 31 capable of being connected in an electrically conducting manner to a plug contact of the measuring cable. The upper leg of the Z, said upper leg being attached to the middle leg, carries a coupling piece 32 which is connected to the coupling piece 31 and which cooperates with a plug 45 of the evaluation device 23, said plug being evident from FIG. 3. A plug contact of the coupling piece 31 can be connected via a long conductor piece to a plug contact 33 which cooperates in the adjacent metal housing with a coupling piece arranged on the jack strip of the plug device 28.

Alternatively, the middle leg of the Z may be designed so as to be relatively short. The coupling piece 31 can then be attached to the underside of the upper leg of the Z and be connected directly to the coupling piece 32.

Figure 3:
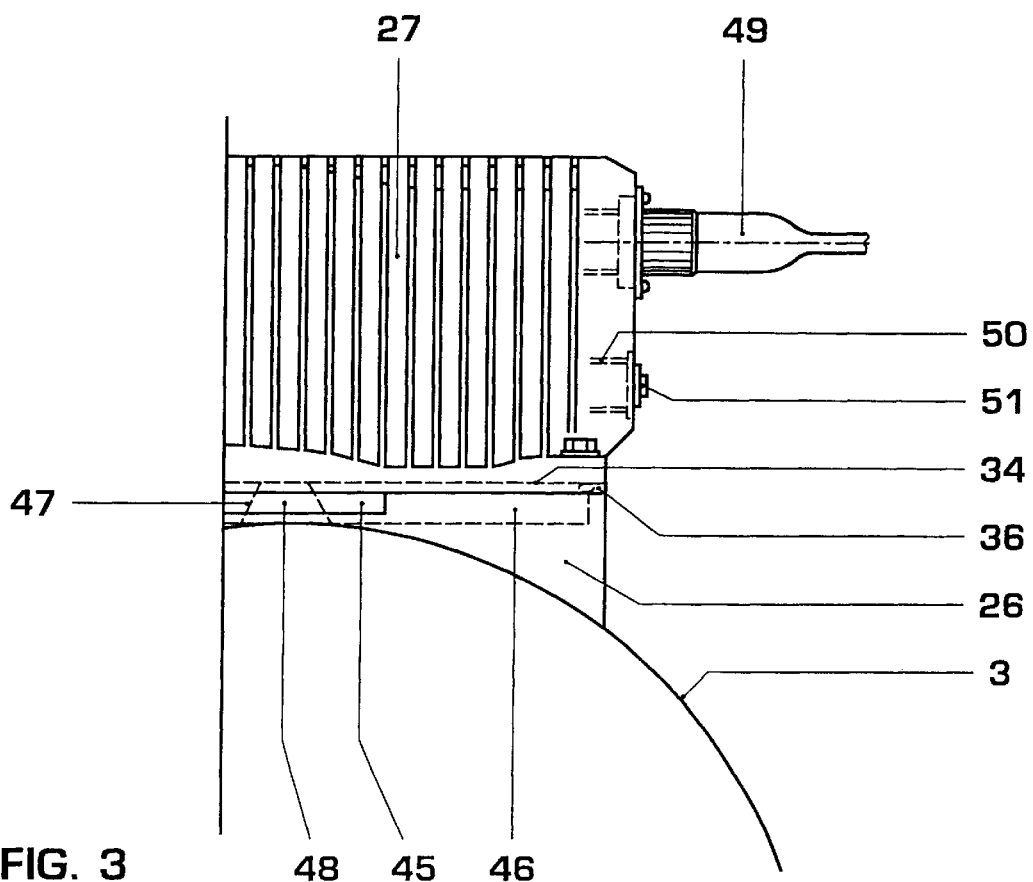
FIG. 3 shows a side view from the right, of a part of the high-voltage system which contains the metal housing.
Figure 4:
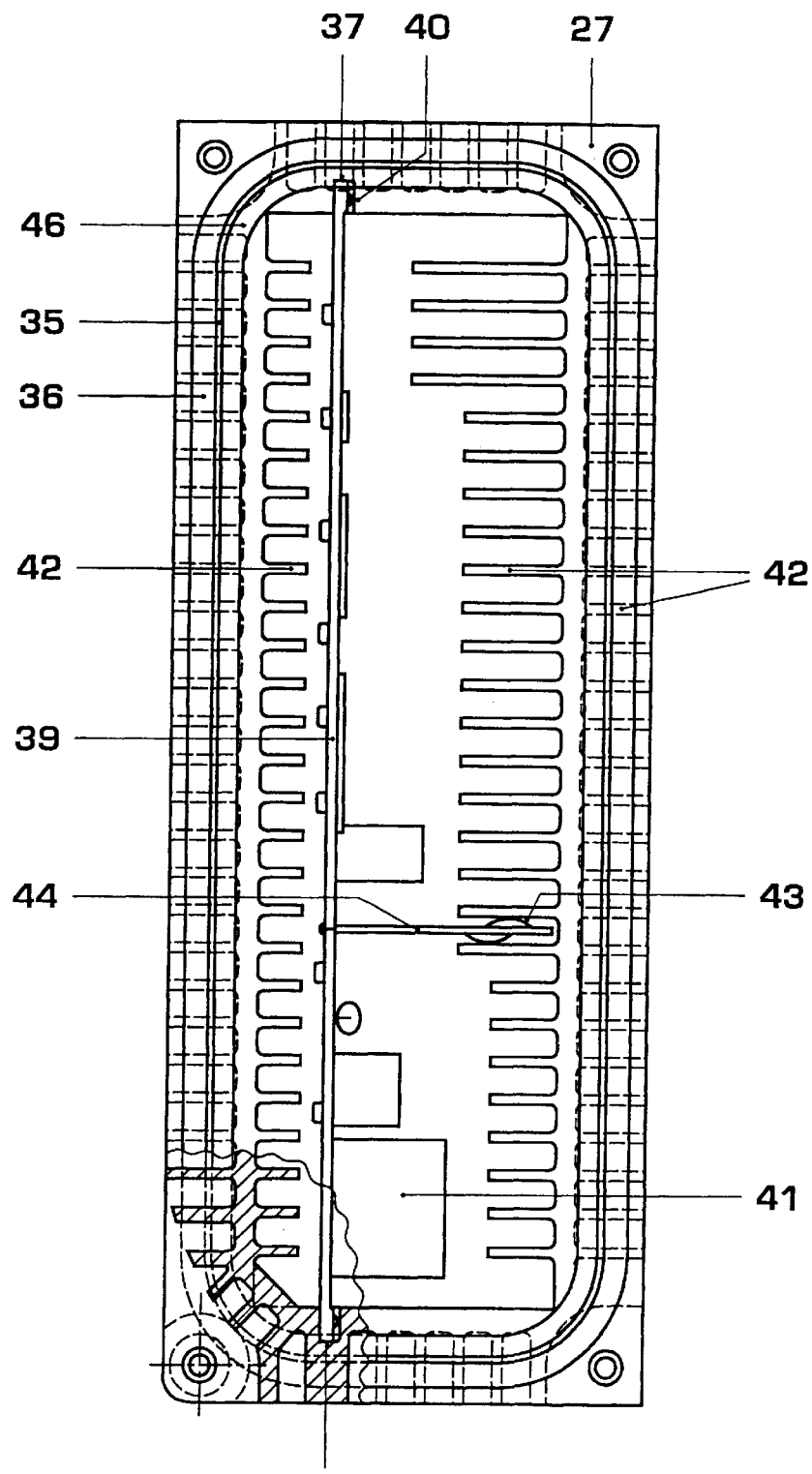
FIG. 4 shows a bottom view of a part of the metal housing which is designed as a trough-shaped housing element.

FIGS. 3 and 4 show the design and arrangement of the metal housing containing the evaluation device 23 or 23'. The hollow flange 26 has a plane contact face 34 (FIG. 3) which is led around the flange orifice and which cooperates, to form an electrical connection, with a plane contact face 35 of the trough edge (FIG. 4), said contact face 35 being led around the trough orifice. The two parts of the metal housing which are formed essentially by the hollow flange 26 and the housing element 27 are thus connected in an electrically conducting manner to one another and constitute a Faraday cage for the evaluation device. The two annularly closed contact faces are surrounded by at least one O-ring 36 clamped between the hollow flange 26 and the trough edge. A virtually gastight connection of the two housing parts is thereby achieved and, at the same time, the two contact faces 34 and 35 are protected against pollutants infiltrating from outside.

At least one groove 37 and 38 extending from the trough edge in the direction of the trough bottom is formed in each case on mutually opposite inner faces of the housing element 27 (FIG. 4). This groove serves for receiving one edge of a printed board 39 of the evaluation device, said printed board being capable of being connected in an electrically conducting manner to one or more plug contacts of the plug device 28 or 28'. The groove 37 or 38 is designed with oversize and additionally receives contact springs 40 attached to the edge of the printed board 39. Conductor tracks of the printed board 39 which are connected to the contact springs are thus brought to the potential of the metal housing. Electronic components located on the printed board 39 and having a covering 41 electrically connected to the contact springs 40 are thus screened electromagnetically.

Cooling ribs 42 are formed in the trough-shaped housing element 27 on the inside and/or outside. The inner cooling ribs absorb heat generated by the electronic components. This heat is conducted outward and discharged into the environment by the outer cooling ribs. The inner cooling ribs may perform additional functions. As is evident from FIG. 4, one edge and contact springs 43 of a plate-shaped electromagnetic screen 44 of the evaluation device, said screen being located between two electronic components, may be arranged between two adjacent cooling ribs 42. This screen 44 acts as an electromagnetic barrier between the adjacent electronic components.

The trough orifice is closed off by means of an electromagnetically screening cover plate and by means of the plug 45 which is led through an orifice of the cover plate and which carries plug contacts cooperating with the coupling piece 32. The housing element 27 has a collar 46 which projects above the trough edge and which is led through the flange orifice of the hollow flange 26. Moreover, the collar 46 projects beyond the plug 45 and has a material cutout 48 cooperating with a protrusion 47 of the hollow flange 26 (FIG. 3).

The collar 46 performs the following functions: when the measuring device is being assembled, said collar guides the housing element 27 into the hollow flange 26. At the same time, the protrusion 47 cooperating as a means of orientation with the material cutout 48 ensures that the housing element 27 and consequently the plug 45 are introduced into the coupling piece 32 in the correct position. This rules out the possibility that the output signal from, for example, one of the Rogovski coils 11 will be led by means of an incorrect plug connection to an electronic component of the evaluation device which is unsuitable for processing it. Since the collar 46 projects beyond the plug 45, the latter, during assembly, cannot come into contact with part of the hollow flange and thereby be damaged.

It is advantageous, during assembly, if the jack strip 29 is floatingly mounted. Unavoidable deviations in the position of the coupling piece 32 and plug 45 can thus be compensated in a particularly simple way.

As is evident from FIG. 3, the housing element 27 has attached to it a plug 49 which cooperates with a coupling piece led through the wall of the housing element 27 and connected to the evaluation device 23 or 23'. By means of the plug connection thus formed, the evaluation device 23 or 23' communicates, preferably via interference-free optical fibers, with a higher-level control system, and the evaluation device 23 or 23' is simultaneously supplied with electrical energy via a wire connection. The communication comprises, above all, the transmission of digitized measurement values, for example current, voltage, temperature, pressure or density, to the control system, but may also serve for the transmission of information formed in the control system to the evaluation unit 23 or 23'.

A ventilating orifice 50, into which a bolt-shaped ventilating device 51 is screwed, is also led through the wall of the housing element 27. As is evident from FIG. 5, this ventilating device has a bush 52 provided with an external thread and capable of being fixed in the ventilating orifice 50 by being screwed in. The bush 52 is open on the end face facing outward. That end face of the bush 52 which faces the interior of the metal housing formed by the hollow flange 26 and housing element 27 is formed by a wall 53 attached to the hollow-cylindrical bush wall and having a centrally arranged orifice. A sealing ring 54 supported on the wall 53, a diaphragm 55 resting on the sealing ring and a cylindrical bolt 56 are arranged inside the bush 52. The bolt 56 has, on its outer surface, an external thread cooperating with an internal thread of the bush 52 and, on its end face located outside the ventilating orifice 50, a radially guided slot 57 for a screwdriver. By screwing in the bolt 56, the diaphragm 55 is pressed against the sealing ring 54 supported on the wall 53 and a gastight mounting of the diaphragm 55 in the bush 52 is thus achieved. The bush 52 is fixed in the ventilating orifice 50 by means of a watertight adhesive embedded in the thread flights.

The diaphragm 55 acts as an air-permeable, dust-separating and water-repellant valve which leads water vapor, present in the housing interior or formed there, outward, but not water from outside into the housing interior. The formation of condensation water in the housing interior and consequently an impairment of the operating capacity of the evaluation device 23 or 23' are thus avoided. At the same time, the diaphragm 55 prevents dust from infiltrating into the housing interior. The diaphragm is composed of one or more layers of a fiber material preferably designed as a woven fabric. Such material is, for example, sold by the company GORE under the brand name of GORETEX recorded as a registered trademark.

A splashwater guard formed by the bolt 56 precedes the diaphragm. The splashwater guard contains a labyrinth of ducts which prevents splashwater from infiltrating to the diaphragm 55 and which allows splashwater which has penetrated to escape.

Figure 5:
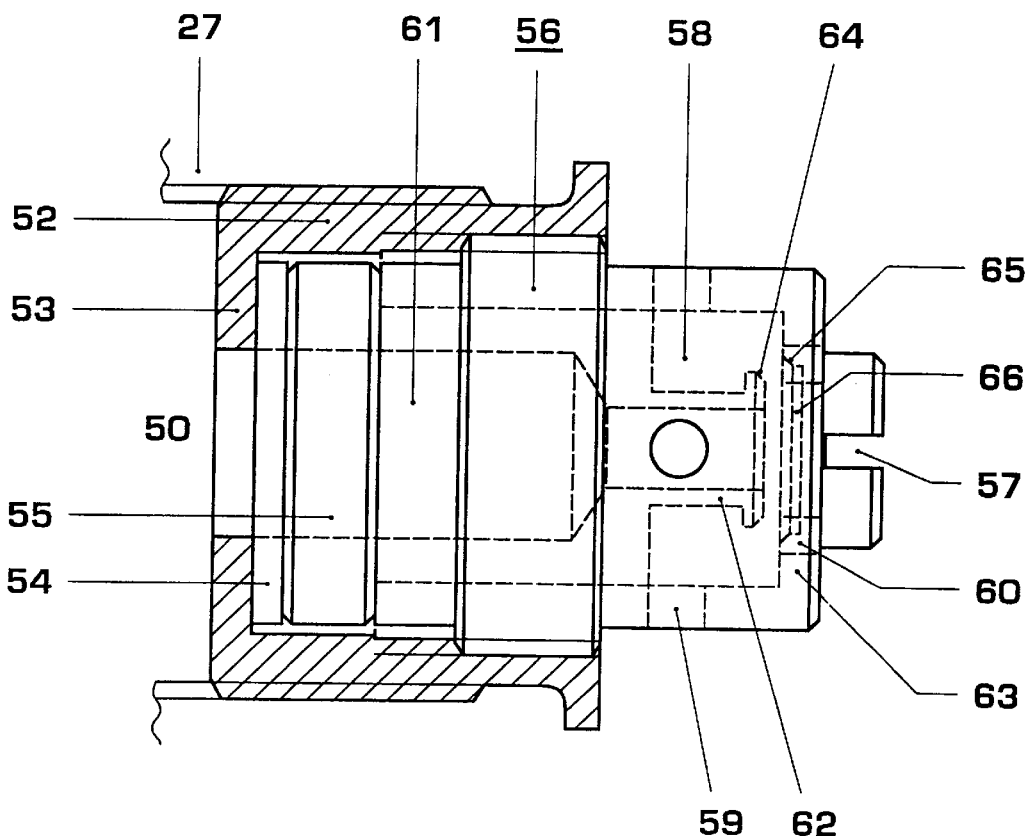
FIG. 5 shows a side view of a ventilating device arranged in a ventilating orifice of the housing element according to FIG. 4.
Figure 6:
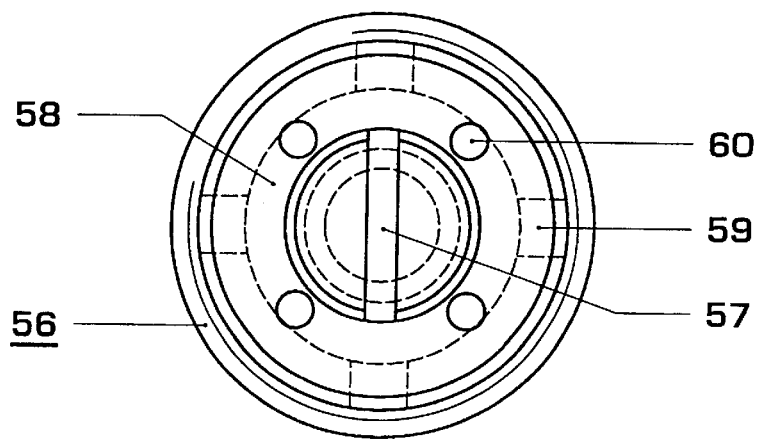
FIG. 6 shows a top view of a splashwater guard of the ventilating device according to FIG. 5.
Figure 7:
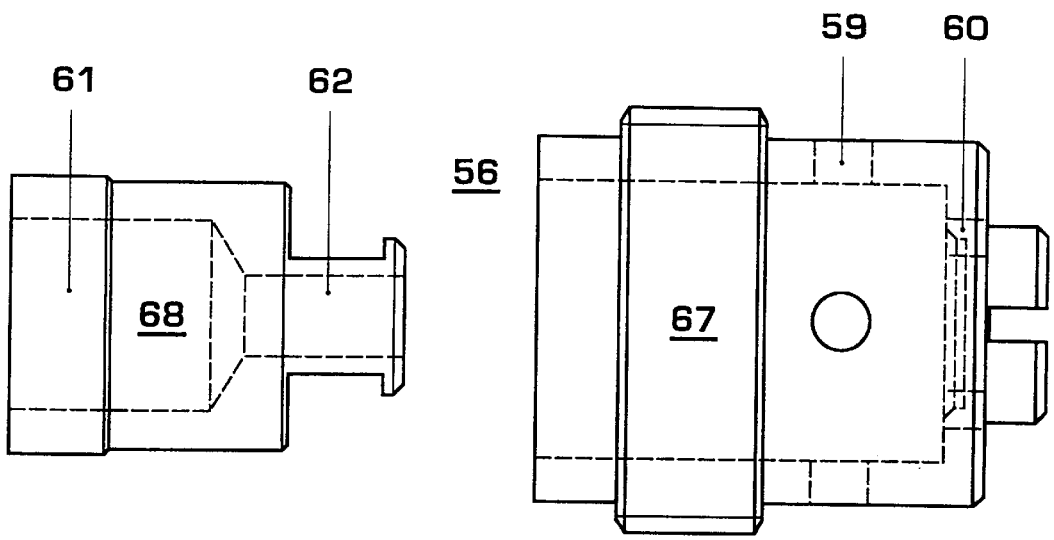
FIG. 7 shows an exploded illustration of the splash-water guard according to FIG. 6.

In FIGS. 5 to 7, the labyrinth is illustrated by broken lines. It has a prechamber 58 arranged in the bolt interior. This prechamber 58 is of annular design and communicates with the outside via eight orifices 59 and 60. Of these eight orifices, four orifices 59 arranged offset at 90° relative to one another are led radially outward and four orifices 60 likewise arranged offset at 90° relative to one another are led axially outward. Furthermore, the labyrinth has a main chamber 61 extended in the axial direction in the bolt 56 and led to the diaphragm 55. This main chamber 61 is connected to the prechamber 58 via at least one baffle.

To connect the main chamber 61 and prechamber 58, a duct delimited by a mushroom-shaped, axially oriented hollow pin 62 and a wall 63 oriented essentially transversely to the pin 62 is provided. That edge 64 of the mushroom cap which faces the wall 63 and an opposite edge 65 of a circular groove 66 let into the wall have a beveled design so as to form an annular duct in the shape of a hollow cone frustum.

The four axially guided orifices 60 provided in the wall 63 are arranged in such a way that infiltrating splashwater merely enters the prechamber 58 or, at most, impinges on the beveled edge 64 of the mushroom cap. The radially guided orifices 59 are arranged in the outer surface of the bolt 56 in such a way that infiltrating splashwater can merely impinge on the mushroom stem. Infiltrating splashwater consequently cannot pass into the main chamber 61 and, in any position of the ventilating device 51 and therefore also of the metal housing, is removed again from the prechamber 58 via at least one of the orifices 59 and 60. A precipitation of water on the diaphragm 55 can thus be successfully avoided with a high degree of reliability. Precipitated water which may have frozen could otherwise clog the diaphragm 55. Water vapor formed in the housing interior could then no longer be led into the main chamber 61, and from there to the outside, by the diaphragm 55 which has the effect of a valve.

As is evident from FIG. 7, the bolt 56 is composed of a pot-shaped basic body 67 containing the orifices 59 and 60 and of a bottle-shaped hollow body 68 containing the pin 62 and the main chamber 61. By pressing the hollow body 68 into the basic body 67, the bolt 56 containing the labyrinth can thus be produced in a particularly simple way.

Figure 8:
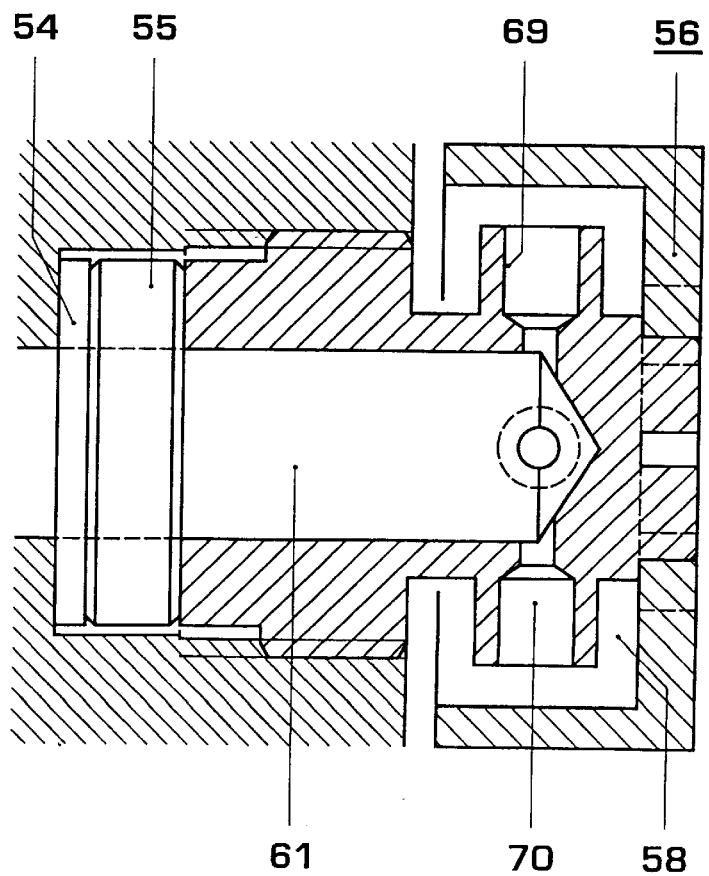
FIG. 8 shows a top view of a section through a further embodiment of a ventilating device, the splashwater guard of which is modified in comparison with the splashwater guard of the ventilating device according to FIG. 5.

An alternative embodiment of the bolt is evident from FIG. 8. In this embodiment, there are provided for connecting the main chamber 61 and prechamber 58 a plurality of radially guided ducts 70 which are arranged in a circumferentially distributed manner and which open into the prechamber 58 in each case by means of a projecting tubular portion 69.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electronic instrument with a two-part housing (26, 27), with at least one printed board (39) surrounded in a dusttight manner by the housing and fitted with at least one electronic component, with at least one ventilating orifice (50) led through one of the two housing parts, and with a ventilating device (51) arranged in the ventilating orifice and having an air-permeable and water-repellant diaphragm (55), wherein a bush (52) provided with an internal thread is inserted in a watertight manner into the ventilating orifice (50), said bush being open on the outwardfacing end face and having, on the end face facing the housing interior, a wall (53) guided in the direction of the bush axis and at least one orifice delimited by the wall, and wherein a sealing ring (54) supported on the wall, the diaphragm (55) resting on the sealing ring (54) and a part of a bolt (56) designed as a splashwater guard, said part cooperating with the internal thread and pressing the diaphragm (55) against the sealing ring (54), are arranged inside the bush (52).

2. The instrument as claimed in claim 1, wherein the bush (52) has an external thread, which cooperates with an internal thread of the housing part (27) receiving the ventilating orifice (50), and is fixed in the ventilating orifice (50) by means of a watertight adhesive embedded in the thread flights.

3. The instrument as claimed in one of claims 1, wherein the bolt (56) contains a labyrinth of ducts which prevents splashwater from infiltrating the diaphragm (55) and which allows splashwater which has penetrated to escape.

4. The instrument as claimed in claim 3, wherein the bolt (56) contains an annularly designed prechamber (58) led outward via a plurality of wall orifices (59, 60) and a main chamber (61) which is extended in the axial direction and is led to the diaphragm (55) and which is connected to the prechamber (58) via at least one baffle.

5. The instrument as claimed in claim 4, wherein a plurality of radially guided ducts (70) arranged in a circumferentially distributed manner and opening into the prechamber (58) in each case by means of a projecting tubular portion (69) are provided for connecting the main chamber (61) and the prechamber (58).

6. The instrument as claimed in claim 4, wherein a duct delimited by a mushroom-shaped, axially oriented hollow pin (62) and by a wall (63) oriented essentially transversely to the pin (62) is provided for connecting the main chamber (61) and the prechamber (58).

7. The instrument as claimed in claim 6, wherein that edge (64) of the mushroom cap which faces the wall (63) and an opposite edge (65) of a circular groove (66) let into the wall (63) have a beveled design so as to form an annular duct in the shape of a hollow cone frustum.

8. The instrument as claimed in claim 7, wherein a first part of the orifices (60) leading the prechamber (58) outward is arranged in the wall (63) in such a way that splashwater entering passes merely into the prechamber (58) or, at most, onto the beveled edge (64) of the mushroom cap.

9. The instrument as claimed in claim 8, wherein a second part of the orifices (59) leading the prechamber (58) outward is arranged in the outer surface of the bolt (56) in such a way that splashwater entering reaches merely the mushroom stem.

10. The instrument as claimed in claim 6, wherein the pin (62) is pressed into a pot-shaped basic body (67) of the bolt (56), said basic body containing the wall (63).

* * * * *